(12) United States Patent
Zhou et al.

(10) Patent No.: US 9,646,668 B2
(45) Date of Patent: *May 9, 2017

(54) SPIN-TRANSFER TORQUE MAGNETIC RANDOM ACCESS MEMORY (STTMRAM) WITH ENHANCED WRITE CURRENT

(71) Applicant: Avalanche Technology, Inc., Fremont, CA (US)

(72) Inventors: Yuchen Zhou, San Jose, CA (US); Ebrahim Abedifard, San Jose, CA (US); Mahmood Mozaffari, Los Gatos, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/524,848

(22) Filed: Oct. 27, 2014

(65) Prior Publication Data

US 2015/0043272 A1    Feb. 12, 2015

Related U.S. Application Data

(63) Continuation-in-part of application No. 13/914,396, filed on Jun. 10, 2013, now Pat. No. 8,879,309, which
(Continued)

(51) Int. Cl.
  *G11C 11/16* (2006.01)
  *G11C 5/06* (2006.01)

(52) U.S. Cl.
  CPC .......... *G11C 11/1675* (2013.01); *G11C 5/063* (2013.01); *G11C 11/1673* (2013.01)

(58) Field of Classification Search
  CPC ....................................... G11C 11/16–11/1697
  See application file for complete search history.

(56) References Cited

U.S. PATENT DOCUMENTS 7,688,614 B2   3/2010   Morimoto
8,053,749 B2   11/2011   Rolbiecki et al.
(Continued)

OTHER PUBLICATIONS

Djayaprawira et al., "230% room-temperature magnetoresistance in CoFeB/MgO/CoFeB magnetic tunnel junctions," Applied Physics Letters 86, pp. 092502-1 to 092502-3 (2005).*

*Primary Examiner* — R Lance Reidlinger
(74) *Attorney, Agent, or Firm* — Maryam Imam; Bing K. Yen

(57) ABSTRACT

A spin-transfer torque magnetic random access memory (STTMRAM) cell is disclosed. The memory cell comprises a selected magnetic tunnel junction (MTJ) identified to be programmed; a first transistor having a first port, a second port and a gate, the first port of the first transistor coupled to the selected MTJ; a first neighboring MTJ coupled to the selected MTJ through the second port of the first transistor; a second transistor having a first port, a second port, and a gate, the first port of the second transistor coupled to the selected MTJ; a second neighboring MTJ coupled to the selected MTJ through the second port of the second transistor; a first bit/source line coupled to the second end of the selected MTJ; and a second bit/source line coupled to the second end of the first neighboring MTJ and the second end of the second neighboring MTJ.

8 Claims, 15 Drawing Sheets

Related U.S. Application Data is a continuation of application No. 13/719,142, filed on Dec. 18, 2012, now Pat. No. 8,611,145, which is a continuation-in-part of application No. 13/546,408, filed on Jul. 11, 2012, now Pat. No. 8,724,378, which is a continuation of application No. 12/756,081, filed on Apr. 7, 2010, now Pat. No. 8,238,145.

(60) Provisional application No. 61/167,859, filed on Apr. 8, 2009.

(56) References Cited

U.S. PATENT DOCUMENTS

| | | | |
|---|---|---|---|
| 8,233,309 B2 | 7/2012 | Fasoli | |
| 8,238,145 B2 * | 8/2012 | Abedifard | G11C 11/16 365/148 |
| 8,611,145 B2 * | 12/2013 | Zhou | G11C 11/16 365/158 |
| 8,724,378 B2 * | 5/2014 | Abedifard | G11C 11/16 365/148 |
| 8,879,309 B2 * | 11/2014 | Zhou | G11C 11/16 365/158 |
| 2008/0112208 A1 * | 5/2008 | Cho | G11C 7/14 365/148 |
| 2008/0273369 A1 * | 11/2008 | Angerbauer | G11C 11/5614 365/148 |

* cited by examiner

SPIN-TRANSFER TORQUE MAGNETIC RANDOM ACCESS MEMORY (STTMRAM) WITH ENHANCED WRITE CURRENT

CROSS REFERENCE TO RELATED APPLICATIONS

The present application is a continuation-in-part of U.S. patent application Ser. No. 13/914,396, filed on Jun. 10, 2013, by Yuchen Zhou, entitled "A Method and Apparatus for Programming a Spin-Transfer Torque Magnetic Random Access Memory (STTMRAM) Array," which is a continuation of U.S. patent application Ser. No. 13/719,142, filed on Dec. 18, 2012, by Yuchen Zhou, and entitled "Spin-Transfer Torque Magnetic Random Access Memory (STTMRAM) Device with Shared Transistor and Minimal Written Data Disturbance", which is a continuation-in-part of U.S. patent application Ser. No. 13/546,408, entitled, "Shared Transistor in a Spin-Torque Transfer Magnetic Random Access Memory (STTMRAM) Cell", by Ebrahim Abedifard, filed on Jul. 11, 2012, which is a continuation of U.S. patent application Ser. No. 12/756,081, entitled "Shared Transistor in a Spin-Torque Transfer Magnetic Random Access Memory (STTMRAM) Cell", by Ebrahim Abedifard, filed on Apr. 7, 2010, which claims benefit of U.S. Provisional Patent Application No. 61/167,859, entitled "Shared Transistor in a Spin-Torque Transfer Magnetic Random Access Memory (STTMRAM) Cell", by Ebrahim Abedifard, filed on Apr. 8, 2009.

BACKGROUND OF THE INVENTION

Field of the Invention

This invention relates to a spin-transfer torque magnetic random access memory (STTMRAM) cell, and, more particularly, to a configuration of STTMRAM cells having significantly smaller cell size and a tolerance for higher switching current density.

Description of the Prior Art

It is anticipated that spin transfer torque magnetic random access memory (STTMRAM) will be commonly employed as non-volatile memory in a wide variety of applications in the near future. Benefits realized by this type of memory include smaller memory size, scalability of manufacturing, and low current consumption, among others.

At the most abstract level, STTMRAM comprises a plurality of STTMRAM memory cells, otherwise known a memory array. Each memory cell includes a memory element and an access (or select) transistor. Generally, each memory element includes a magnetic tunnel junction (MTJ) having a free layer, fixed layer, and a barrier layer there between; as well as any other layers necessary or advantageous to the operation of the MTJ (e.g., a cap layer, pinning layer, or under layer).

An MTJ may typically be switched between a parallel or anti-parallel state. In the parallel state, the storage layer, commonly referred to as the free layer of the MTJ, has a magnetic orientation that is substantially in the same direction as that of the MTJ's fixed layer. The magnetic orientation of the fixed layer is static, being permanently fixed during fabrication, while the magnetic orientation of the free layer is intentionally capable of switching from one direction to an opposite direction so as to differentiate between two binary states, i.e. '0' or '1'. In an anti-parallel state, the magnetic orientation of the free layer is opposite to the magnetic orientation the fixed layer. The resistance of the MTJ changes depending on its state of parallel and anti-parallel. Typically, the resistance of the MTJ is higher at an anti-parallel state than at a parallel state.

A memory cell typically includes a MTJ and an access transistor. The latter is used to read and write to the MTJ, basically allowing access thereto. However, the requirement of having one transistor per MTJ makes for a large memory cell. Moreover, the access transistor need be large enough to accommodate the large current required for causing the MTJ to switch from one magnetic orientation to another. Currently, for a given switching current of an MTJ, the memory cell size is intolerably large, in the order of greater than $20F^2$, where F represents Minimum Feature Size.

The process of reading prior art STTMRAM memory cells, i.e., a "read operation", is not sufficiently reliable and requires improvement. An example of where improvement is necessary includes reducing the sense current, the current applied to the MTJ during a read operation, to be significantly lower than the current which is used to perform a write operation (write current). Otherwise the state (or magnetization direction) of the MTJ may be undesirably changed (e.g., written) during what is intended to be a read operation. This is unacceptable because the state of the MTJ is representative of the bit value stored, and, if erroneously changed, the data thereby is corrupted.

The number of devices is increasing in which STTMRAM is a viable storage option. However, as the applications for these devices become ever more demanding of the hardware, the actual devices are shrinking in response to consumer demands for portability. Thus, as memory capacities increase, the footprint of the memory component must concurrently decrease.

Therefore, in light of the foregoing, what is needed is a shared transistor STTMRAM memory cell made of a memory element and an access transistor, the shared transistor configuration reducing the memory cell footprint while increasing both the memory element density and the switching current density.

IN THE DRAWINGS

SUMMARY OF THE INVENTION

Figure 1:
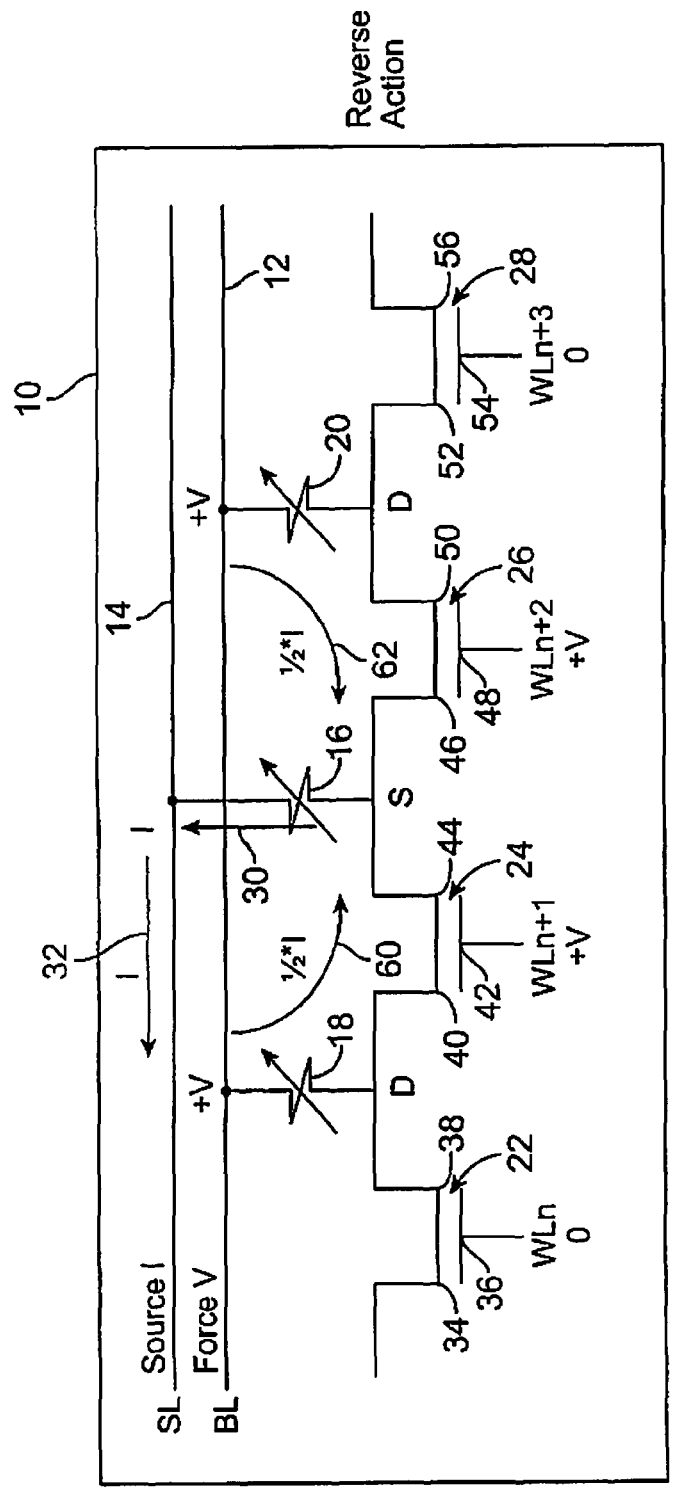
FIG. 1 shows a portion of a STTMRAM array 10 in accordance with an embodiment of the present invention.

Briefly, method of writing to a spin-torque transfer memory random access memory (STTMRAM) cell of an STTMRAM array is disclosed by setting the voltage of a bit line that is coupled to a selected magnetic tunnel junction (MTJ) to be substantially equal to a voltage Vcc. Further, setting the voltage of a sense line (SL) that is coupled to a first neighboring MTJ to be substantially equal to zero, the first neighboring MTJ being coupled to a first transistor that is coupled to the first neighboring MTJ, the selected MTJ being coupled to a second transistor, the first and second transistors each having a gate coupled to a respective word line. Further, maintaining the voltage of bit lines and sense lines coupled to the MTJs of the STTMRAM array, other than the bit line and sense line that are coupled to the selected MTJ and the first neighboring MTJ, substantially equal to the voltage Vcc and raising the voltage of each of the word lines coupled to the gates of the first and second transistor to a voltage that is equal or higher than the voltage Vcc to program the selected MTJ.

These and other objects and advantages of the present invention will no doubt become apparent to those skilled in the art after having read the following detailed description of the various embodiments illustrated in the several figures of the drawing.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a selected spin-transfer torque magnetic random access memory (STTMRAM) cell includes a selected magnetic tunnel junction (MTJ) and an access transistor, the MTJ identified to be programmed by switching the state thereof upon application of switching current sufficient to switch the magnetic state of the selected MTJ. Adjacent to the selected MTJ are two neighboring MTJs. The first neighboring MTJ is coupled to the selected MTJ through the above-noted access transistor, and the second neighboring MTJ is coupled to the selected MTJ through a second access transistor.

In accordance with an embodiment of the present invention, a first bit line/source line is coupled to the selected MTJ, and a second bit line/source line is coupled to both the first neighboring MTJ and the second neighboring MTJ. During programming (or writing), the switching current applied to the selected MTJ is derived from the current through the first and second neighboring MTJs, with substantially half of the switching current being provided by the first neighboring MTJ and the remainder of the switching current being provided by the second neighboring MTJ.

In accordance with an embodiment of the present invention, each transistor is shared by two STTMRAM elements, and each MTJ is coupled to two transistors, thereby achieving a cell layout size of $12F^2$, where F represents Minimum Feature Size, commonly employed as a unit of measure for memory cells. The STTMRAM cell of the various embodiments of the present invention tolerates higher switching current density.

Referring now to FIG. 1, a portion of a STTMRAM array 10 is shown in accordance with an embodiment of the present invention. The array 10 is shown to include transistors 22, 24, 26 and 28, which are each commonly referred to as access transistors and MTJs 16, 18 and 20, in accordance with an embodiment of the present invention. It is noted that the array 10 typically comprises many more transistors and MTJs than that which is shown in FIG. 1.

In the embodiment of FIG. 1, switching current, i.e., the threshold current for switching the state of a selected magnetic tunnel junction (MTJ), is shown to flow from the bottom of the page to the top of the page (or from line 12 to line 14), in a direction shown by the arrow 30, and to left of the page, in a direction shown by the arrow 32. This path or direction of current flow is from here on defined as "reverse direction".

The MTJs of the array 10 are arranged such that MTJ 16 has two neighboring MTJs, neighboring MTJ 18 and neighboring MTJ 20. MTJ 16 is herein referred to as "selected" MTJ 16 because, by way of example, in the embodiments disclosed herein, MTJ 16 is the exemplary MTJ to which writing and read current is applied. It is understood that other MTJs in the array 10 may be selected for reading or writing.

Each of the transistors 22, 24, 26 and 28 includes a gate that is coupled to the word line. For example, transistor 22 has a gate 36 that is coupled to the word line 'n' or WLn, transistor 24 has a gate 42 that is coupled to the word line 'n+1" or WLn+1, transistor 26 has a gate 48 that is coupled to the word line 'n+2' or WLn+2 and the transistor 28 has a gate 54 that is coupled to the word line n+3 or WLn+3.

Bit/source line 12 is a shared bit and source line. Bit/source line 12 is "shared", because depending on the direction of switching current applied to the selected MTJ, it may be either the bit line or the source line. Similarly, bit/source line 14 is a shared bit and source line, and, depending on the direction of the switching current applied to the selected MTJ, it may be either the bit line or the source line. In the embodiment of FIG. 1, the direction of the flow of the switching current, as shown by the arrows 30 and 32, causes bit/source line 12 to be the bit line, and bit/source line 14 to be the source line.

Transistor 22 has a source port 34 and a drain port 38, transistor 24 has a drain port 40 and a source port 44, transistor 26 has a source port 46 and a drain port 50, and transistor 28 has a drain port 52 and a source port 56.

It is understood that array 10 typically includes more than four transistors and three MTJs, but for the sake of simplicity only a subset of transistors and MTJs of array 10 are shown in FIG. 1. For example, array 10 may include additional transistors to the left of transistor 22 and/or to the right of transistor 28. Similarly, array 10 may include MTJs to the left of MTJ 18 and/or to the right of MTJ 20. Similarly still, array 10 may include additional MTJs and transistors located above and below the MTJs and transistors shown in FIG. 1.

One side of MTJ 18 is coupled to both the port 38 of transistor 22 and the port 40 of transistor 24; and at the other side of MTJ 18 it is coupled to bit/source line 12.

One side of MTJ 16 is coupled to the port 44 of transistor 24 and the port 46 of transistor 26; at the other side of MTJ 16 it is coupled to bit/source line 14.

One side of MTJ 20 is coupled to both the port 50 of transistor 26 and the port 52 of transistor 28; and at the other side of MTJ 20 it is coupled to bit/source line bit/source line 12.

It is understood that while two bit/source lines are shown in FIG. 1, in actual operation employing additional MTJs and transistors, additional bit/source lines may be connected.

In the arrangement shown in FIG. 1, MTJ 16 is coupled to MTJ 18 through transistor 24, and MTJ 16 is further coupled to MTJ 20 through transistor 26.

Depending on the flow of the switching current through the selected MTJ, the ports of the transistors act as drain (D) or as source (S). More specifically, in array 10 of FIG. 1, depending upon the flow of switching current through selected MTJ 16, the ports of transistor 24 may be either drain or source, and the ports of transistor 26 may be either drain or source. As array 10 is shown in FIG. 1, with the flow of the switching current through the selected MTJ 16 to bit/source line 14, port 40 of transistor 24 is the drain and port 44 of transistor 24 is the source, port 46 of transistor 26 is the source and port 50 of transistor 26 is the drain, and port 52 of transistor 28 is the drain and port 56 of transistor 28 is the source.

In the embodiment of FIG. 1, selected MTJ 16 may be programmed (written to), or read. As is readily known to those skilled in the art, an MTJ includes a free layer, a barrier layer and a fixed layer with the free layer switching its magnetic orientation from parallel to anti-parallel or vice versa relative to the fixed layer when sufficient switching current flows through the MTJ. Such switching results in the declaration of a logic state from '0' to '1' or '1' to '0'. Where the current, 'I', is adequate to switch the free layer of selected MTJ 16, thereby programming selected MTJ 16, it is known as the "switching current". During programming of the selected MTJ 16, substantially half of I (or ½×I) passes from bit/source line 12 through MTJ 18 and transistor 24 to selected MTJ 16, and another (or the remaining) half of I (or ½×I) passes from bit/source line 12 through MTJ 20 and transistor 26 to selected MTJ 16. Transistors 24 and 26 are substantially of equal size, thereby rendering the current flowing through each of these transistors to be of substantially equally amount. Therefore, the current passing from bit/source line 12 through MTJ 18 and transistor 24 to selected MTJ 16 and the current passing through from bit/source line 12 through MTJ 20 to selected MTJ 16 are the same. The direction of current flow in this scenario is represented in FIG. 1 by arrow 60, indicating the current flowing through MTJ 18 to MTJ 16, and by arrow 62, indicating the current flowing through MTJ 20 to MTJ 16.

Thus, during programming of selected MTJ 16, upon selecting or identifying MTJ 16, half of I is passed from each of the MTJs 18 and 20 through the MTJ 16 and accumulated. The reduced current of ½ I, which is passed through each of the MTJs 18 and 20, is advantageously not enough to write or program the unselected MTJs, MTJs 18 and 20. In accordance with an embodiment of the present invention, the current sufficient for writing an MTJ, or reversing the magnetic orientation of its free layer, is about 150 to 250 µA. Accordingly, during writing, each of the neighboring MTJs thereby passes about 75 to 125 µA to the selected MTJ.

The writing current may pass through selected MTJ 16 in one of two directions, depending on the value being written to MTJ 16. That is, writing current passed through the selected MTJ 16 in one direction, e.g., from line 12 to line 14, writes a first value, e.g., 0; while changing the voltage point of the circuit causes writing current to pass through selected MTJ 16 in the opposite direction, e.g., from line 14 to line 12, writing a second value, e.g., 1.

In accordance with an embodiment of the present invention, the voltage applied during a write operation may be close to Vcc, which, in an exemplary embodiment, is approximately 1.2 volts.

In accordance with an embodiment of the present invention, selected MTJ 16 of array 10 is read in the following manner. Bit/source line 12, the bit/source line to which that neighboring MTJs are coupled, but not the MTJ selected for reading, is brought up to Vcc. Word line WLn+1 and WLn+2, each of the word lines to which the selected MTJ 16 is coupled via access transistors 24 and 26 respectively, are also pulled up to Vcc. A small current is applied to bit/source line 14, the bit/source line to which selected MTJ 16 is coupled. In one embodiment of the present invention, the small current applied to bit/source line 14 is in the range of 10 to 50 µA.

Selected MTJ 16 then acts as a voltage source where V is equal to the voltage drop across selected MTJ 16, and the voltage drop of MTJ 18 and MTJ 20 is negligible thereby not affecting the voltage on the selected MTJ 16 being sensed.

For a given switching current of an MTJ, as a measure of comparison to prior art techniques, the embodiments herein offer a minimum cell size of $12F^2$ versus prior art techniques, which would require a cell size of greater than $20F^2$.

During a read operation of selected MTJ 16, neighboring MTJs 18 and 20 may each be representing either a '0' or a '1' binary state, making it undesirable for the state of the neighboring MTJs to have any effect upon the value read from MTJ 16. In other words, during a read of selected MTJ 16, MTJ 18 may be storing either a '0' or a '1' value, and, similarly, MTJ 20 may be storing either a '0' or '1' value, thus the states of MTJ 18 and MTJ 20 should be advantageously ignored. By bringing the gates 42 and 48 as well as bit/source line 12 up to Vcc, the states of MTJ 18 and MTJ 20 are effectively ignored.

The voltage sensed on bit/source line 14 during the read operation of selected MTJ 16 is then compared to a reference voltage using read circuitry commonly known in the art. The sensed voltage, when compared to the reference voltage, is used to determine whether selected MTJ 16 is in a high or low state, and, accordingly, its current binary state.

In accordance with an embodiment of the present invention, the voltage applied to gate 42 and gate 48, during a read operation, may be close to Vcc, which, in an exemplary embodiment, is approximately 1.2 volts.

In the embodiment of FIG. 1, word lines WLn and WLn+3 are substantially at a voltage level of 0, while WLn+1 and WLn+2 are substantially at a voltage level of +V.

During a read operation, as will be discussed further below, the selected MTJ, in this case, MTJ 16, is read while advantageously avoiding the resistances of MTJ 16's neighboring MTJs, MTJ 18 and MTJ 20. This is because the voltage across the MTJs 18 and 20 do not affect the voltage across MTJ 16. More specifically, the voltage at port 44 is designed to be equal to or below a certain level and to remain substantially fixed. Namely, the voltage at port 44 is (Vcc−Vt) minus the voltage drop across the transistors 24 and 26, with Vt being the threshold voltage of the transistor 24, while the potential across MTJ 18 is designed to be higher than Vcc−Vt and never being equal to or less than (Vcc−Vt) minus the voltage drop across the transistors 24 and 26, during the read operation. Similarly, the voltage or potential across the MTJ 20 is designed to be higher than Vcc−Vt. This is achieved because the current flowing through SL is a small current value rendering the voltage drop across each of the MTJ 18 and MTJ 20 to be small and almost close to the Vcc level thus rendering the resistances of the MTJs 18 and 20 to be negligible.

In operation, during a read operation, the voltage across MTJ 16 is measured against the voltage of $R_L$ and $R_H$ to determine the logical state of the MTJ 16 without any effects from the MTJs 18 and 20. By way of example, assuming Vcc is 1.2V and Vt is 0.3V and the voltage drop across each of the transistors 24 and 26 (this depends on the size of the transistor but for the sake of simplicity, the voltage drop will be assumed to be equal for these transistors) to be 0.3V, the voltage at port 44 is less than Vcc−Vt−voltage drop across the transistors 24 and 26 (the drop across these transistors is equal to the value of the drop across one transistor due to the parallel configuration of these transistors) or 1.2−0.3−0.3 or 0.6V, whereas, assuming the resistance of MTJ 16 for $R_L$ is 1 kilo ohms and for $R_H$ is 3 kilo ohms, the voltage at port 40 is between 1.18V and 1.14V, respectively. This is so because the voltage at port 40 for the case where MTJ 16 is $R_H$ is Vcc−(3 kilo ohms×20 micro amps) or 1.14V. A similar calculation can be performed for $R_L$ yielding the voltage at port 40 being 1.18V. Thus, because the voltage at port 44 will not exceed 0.6V and therefore will not be in the range experienced by port 40, the resistance of MTJ 18 does not affect the reading of MTJ 16. Due to an analogous reasoning, the resistance of MTJ 20 does not affect the reading of MTJ 20.

Figure 2:
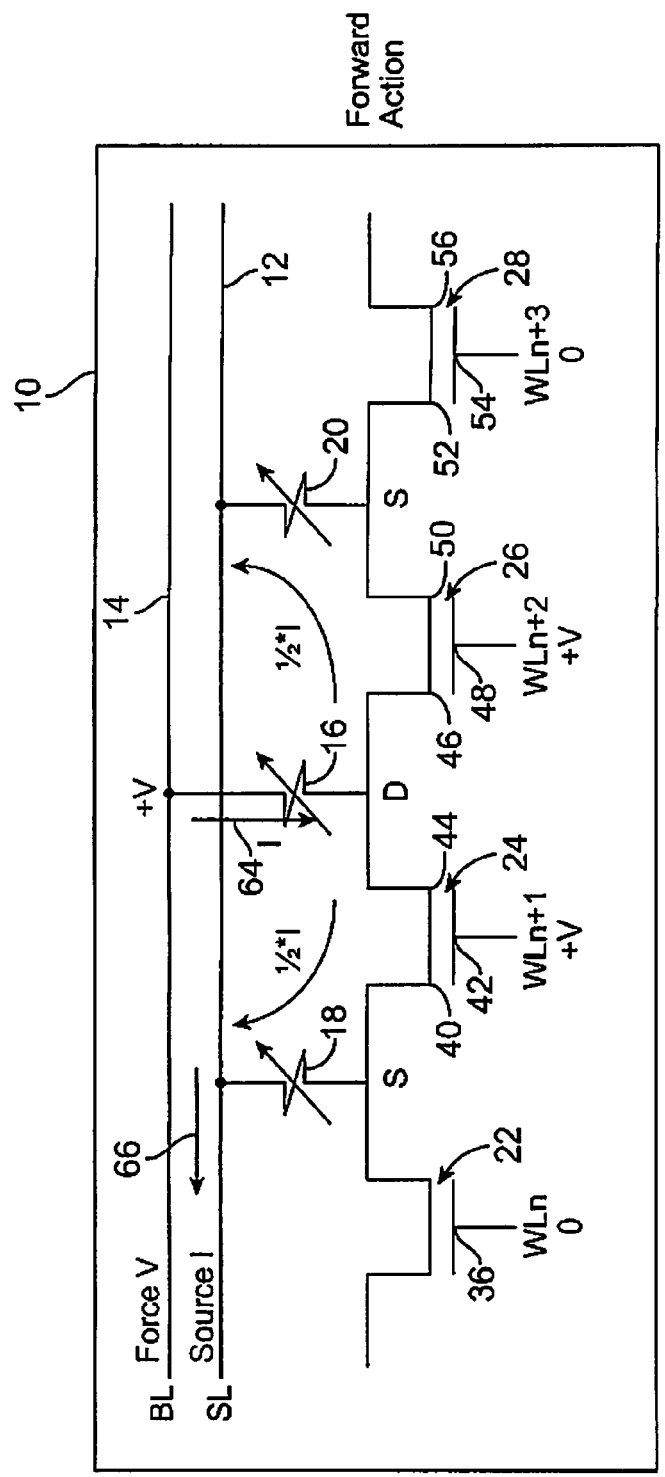
FIG. 2 shows array 10 with the flow of the switching current through MTJ 16 being in a direction opposite to that of MTJ 16 in FIG. 1.

FIG. 2 shows array 10 with the flow of the switching current through selected MTJ 16 being in a direction opposite to that of MTJ 16 in FIG. 1. In array 10 of FIG. 2 switching current through MTJ 16 flows from bit/source line 14 to bit/source line 12, as indicated by arrow 64 and arrow 66. That is, the current, as indicated by arrow 64 and arrow 66, flows from bit/source line 14, through selected MTJ 16, through transistor 24, through MTJ 18, and to bit/source line 12. The direction of current flow through array 10 as shown in FIG. 2 is defined as being in the "forward direction".

The word lines WLn, WLn+1, WLn+2 and WLn+3 remain at the same state as that of FIG. 1. In FIG. 2, bit/source line 12 acts a source line, and bit/source line 14 acts as a bit line. In addition to the reversal in function of bit/source lines 12 and 14 between array 10 of FIG. 1 and array 10 of FIG. 2, in array 10 of FIG. 2 the gates of the transistors 22, 24, 26, and 28 are switched. More specifically, port 40 is now the source of transistor 24 and port 44 is now the drain of transistor 24; port 46 is now the drain of transistor 26 and port 50 is now the source of transistor 26; and port 52 is now the source of transistor 28.

Writing and reading operations are performed in the same manner as described relative to FIG. 1, however, during a read operation, +V is applied to bit/source line 14. Also, during a read operation, unlike a write operation, current is substantially lowered so that the MTJ is not stressed, as read operations can occur an indefinite number of times while write operations occur a finite number of times It is understood that while MTJ 16 is indicated and discussed relative to the various embodiments herein, any MTJ may be selected for programming and/or reading. For example MTJ 18 may be the "selected" MTJ by virtue of selecting MTJ 18 for writing and/or reading. MTJ 18 may be selected and written to by passing ½×I through MTJ 16, and the other ½×I through the other MTJ adjacent to MTJ 18, which is not shown in FIGS. 1 and 2.

In FIGS. 1 and 2, the direction of switching current flow is dependent upon the value being programmed to the selected MTJ. For example, when programming a binary '1', the flow may be in one direction while when programming a binary '0', the flow may be in the opposite direction. In alternative embodiments, the MTJs may be stacked MTJs with each MTJ of the stack having different switching current density (Jc), such as a multi-level cell (MLC) as disclosed in the applications below.

The embodiments of the present invention shown in FIGS. 1 and 2 advantageously allow for symmetric write operations in that a "1" or "0" are written using exactly the same voltage bias condition.

It is understood that MTJs function as variable resistors. In the various embodiments of the present invention, any type of MTJ may be employed. Exemplary MTJs are disclosed U.S. patent application Ser. No. 11/674,124, filed on Feb. 12, 2007, and entitled "NON-UNIFORM SWITCHING BASED NON-VOLATILE MAGNETIC BASED MEMORY", U.S. patent application Ser. No. 11/678,515, filed on Feb. 23, 2007, and entitled "A HIGH CAPACITY LOW COST MULTI-STATE MAGNETIC MEMORY", U.S. patent application Ser. No. 11/739,648, filed on Apr. 24, 2007, and entitled "NON-VOLATILE MAGNETIC MEMORY WITH LOW SWITCHING CURRENT AND HIGH THERMAL STABILITY", U.S. patent application Ser. No. 11/776,692, filed on Jul. 12, 2007, and entitled "NON-VOLATILE MAGNETIC MEMORY ELEMENT WITH GRADED LAYER" and U.S. patent application Ser. No. 11/740,861, filed on Apr. 26, 2007, and entitled "A HIGH CAPACITY LOW COST MULTI-STACKED CROSS-LINE MAGNETIC MEMORY" and U.S. patent application Ser. No. 11/932,940, filed on Oct. 31, 2007, and entitled "CURRENT-CONFINED EFFECT OF MAGNETIC NANO-CURRENT-CHANNEL (NCC) FOR MAGNETIC RANDOM ACCESS MEMORY (MRAM)" and U.S. patent application Ser. No. 12/397,255, filed on Mar. 3, 2009, and entitled "A MULTI-STATE SPIN-TORQUE TRANSFER MAGNETIC RANDOM ACCESS MEMORY", the disclosures of which are incorporated by reference as though set forth in full.

Figure 3:
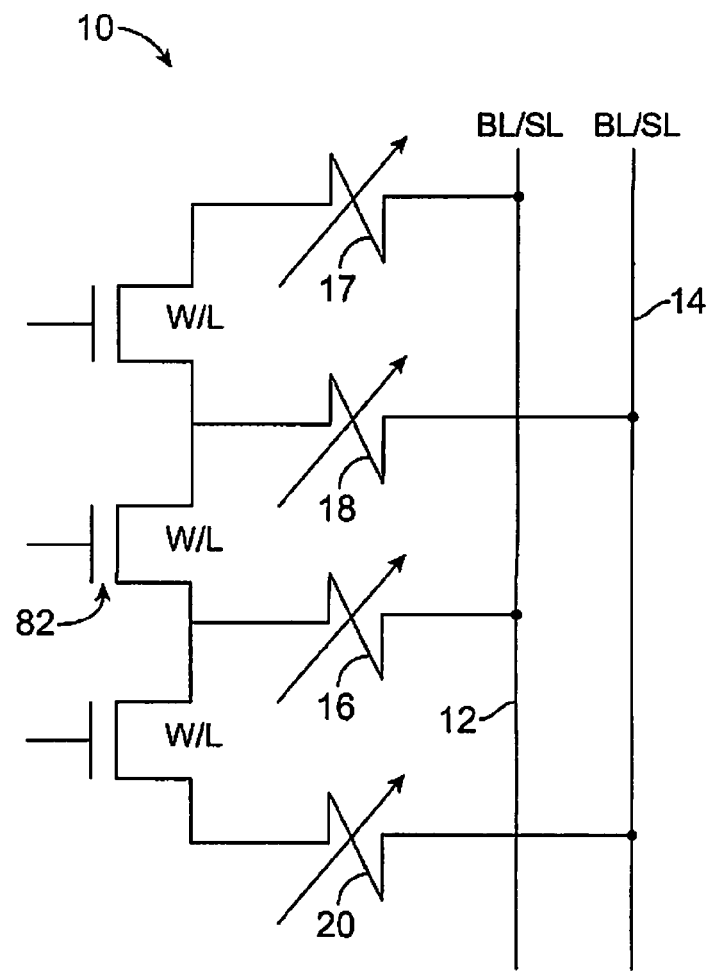
FIG. 3 shows the array 10 of FIGS. 1 and 2 in schematic form.

FIG. 3 shows the array 10 of FIGS. 1 and 2, in schematic form, but with fewer transistors shown and an additional MTJ shown relative to FIGS. 1 and 2. FIG. 3 better shows how each MTJ is alternatively connected to either one of bit/source line 12 or bit/source line 14. For example, as shown in FIG. 3, MTJ 17 is next to MTJ 18, MTJ 18 is next to MTJ 17 and MTJ 16, MTJ 16 is next to MTJ 18 and MTJ 20, and MTJ 20 is next to MTJ 16. MTJ 17 is shown connected to bit/source line 12, whereas MTJ 18, which is positioned next to MTJ 17, is shown connected to bit/source line 14; still further, MTJ 16, which is positioned next to MTJ 18, is shown connected to bit/source line 12; and MTJ 20, which is positioned next to MTJ 16, is shown connected to bit/source line 14. Such a configuration enables neighboring MTJs to pass ½×I to the selected MTJ without interference. Transistor 82 is coupled to both MTJ 18 and MTJ 16 for read and write operations.

For simplicity, only the four MTJs 16, 17, 18, and 20 are shown in FIG. 3, but it is understood that additional MTJs exist above MTJ 17 and additional MTJs exist below MTJ 20 as shown. These additional MTJs would are connected to bit/source line 12 and bit/source line 14 in the same alternating manner.

Figure 4:
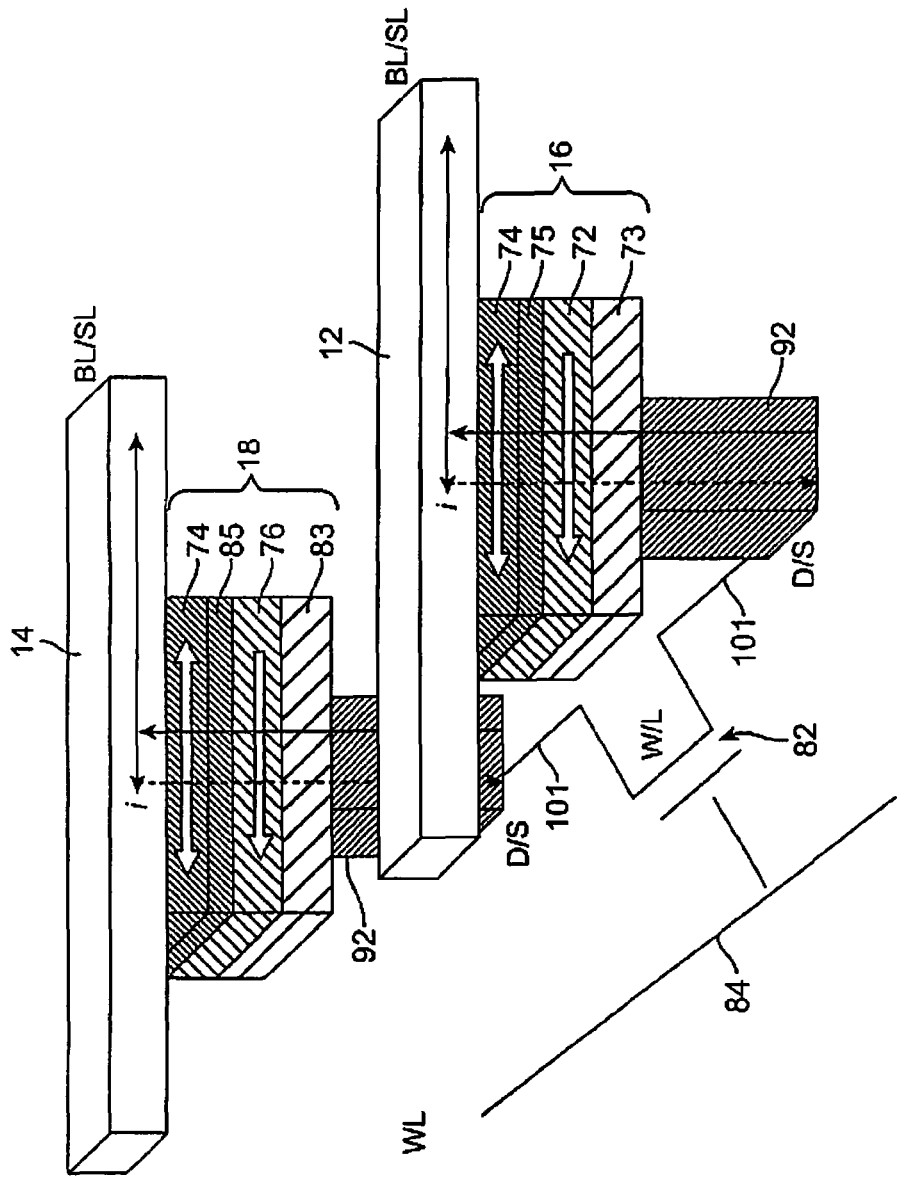
FIG. 4 shows a portion of the array 10 with the relevant layers of two of the MTJs and the two MTJs coupled to a common transistor.

Referring now to FIG. 4, a portion of the array 10, with the relevant layers of two of memory elements including MTJ 16 and MTJ 18, is shown. MTJ 16 and MTJ 18 are shown coupled to a common transistor, transistor 82. In this manner, FIG. 4 shows a detailed three-dimensional view of the MTJs 16 and 18 of array 10 of FIG. 3. MTJs 16 and 18 are included in respective memory elements that also include layers in addition to the MTJ layers. For example, MTJ 16 is shown included in a memory element that additionally comprises a pinning layer 73. On top of pinning layer 73 is formed fixed layer 72, on top of fixed layer 72 is formed an intermediate (or "barrier" or "tunneling") layer 75, and on top of intermediate layer 75 is formed free layer 74. The layers 73, 72, 75 and 74 collectively comprise a memory element and may sometimes be referred to as MTJ 16. Similarly a memory element is shown to include MTJ 18 and additionally includes a pinning layer 83, on top of pinning layer 83 is formed fixed layer 76, on top of fixed layer 76 is formed intermediate layer 85, and on top of intermediate layer 85 is formed free layer 78. The layers 83, 76, 85, and 74 collectively comprise a memory element or sometimes may be considered to comprise MTJ 18. The intermediate layers 75 and 85 may be any layer known to those skilled in the art to separate the respective free and fixed layers. For example, intermediate layers 75 and 85 may otherwise be referred to as a barrier layer, and comprise a layer of MgO in accordance with an embodiment of the present invention. In alternative embodiments of the present invention, intermediate layers 75 and 85 may be tunneling layers. While the magnetization directions of the free layers 74 and the fixed layers 72 and 76 illustrated in FIG. 4 are oriented in directions that lie within the layer planes thereof, the magnetization directions of the same layers 72, 74, and 76 may alternatively be oriented in directions that are perpendicular to the layer planes thereof, thereby forming perpendicular MTJs.

Formed upon each of the free layers 74, is a bit/source line. As discussed relative to FIGS. 1 and 2, the bit/source lines 12 and 14 of adjacent MTJs disclosed herein (e.g., MTJs 16 and 18) are complementary to each other. For example, when bit/source line 12 operates as a bit line in a read or write operation, then bit/source line 14 operates as a source line. Conversely, when bit/source line 12 operates as a source line in a read or write operation, then bit/source line 14 operates as a bit line.

In FIG. 4, word line 84 is shown coupled to the gate of transistor 82, and drains/sources 101 are shown coupled to a respective MTJ through a corresponding and respective contact 92. Each of contacts 92 may be formed of any material capable of passing current from transistor 82 to its respective MTJ, or from the respective MTJ to transistor 82.

Each of MTJ 16 and MTJ 18 has a drain/source 101, to which it is connected through a contact 92. As discussed relative to FIGS. 1 and 2, drains/sources 101 may each function as either a drain or a source. Whether a drain/source 101 functions as a drain or a source at any particular time is dependent upon the direction of current flow. Current is shown to flow bi-directionally depending on the value being programmed, such as a '1" or '0'. Generally, when MTJ 16 is being read or written by the passage of $\frac{1}{2} \times I$ through MTJ 18 or when MTJ 18 is being read or written by the passage of current of $\frac{1}{2} \times I$ through MTJ 16, each of the sources/drains 101 shown in FIG. 4 serve opposite but complementary roles. In other words, when the source/drain 101 connected to MTJ 18, through its respective contact 92, is the source, then the source/drain 101 connected to MTJ 16 is the drain. Conversely, when the source/drain 101 connected to MTJ 18 is the drain, then the source/drain 101 connected to MTJ 16 is the source.

Figure 5:
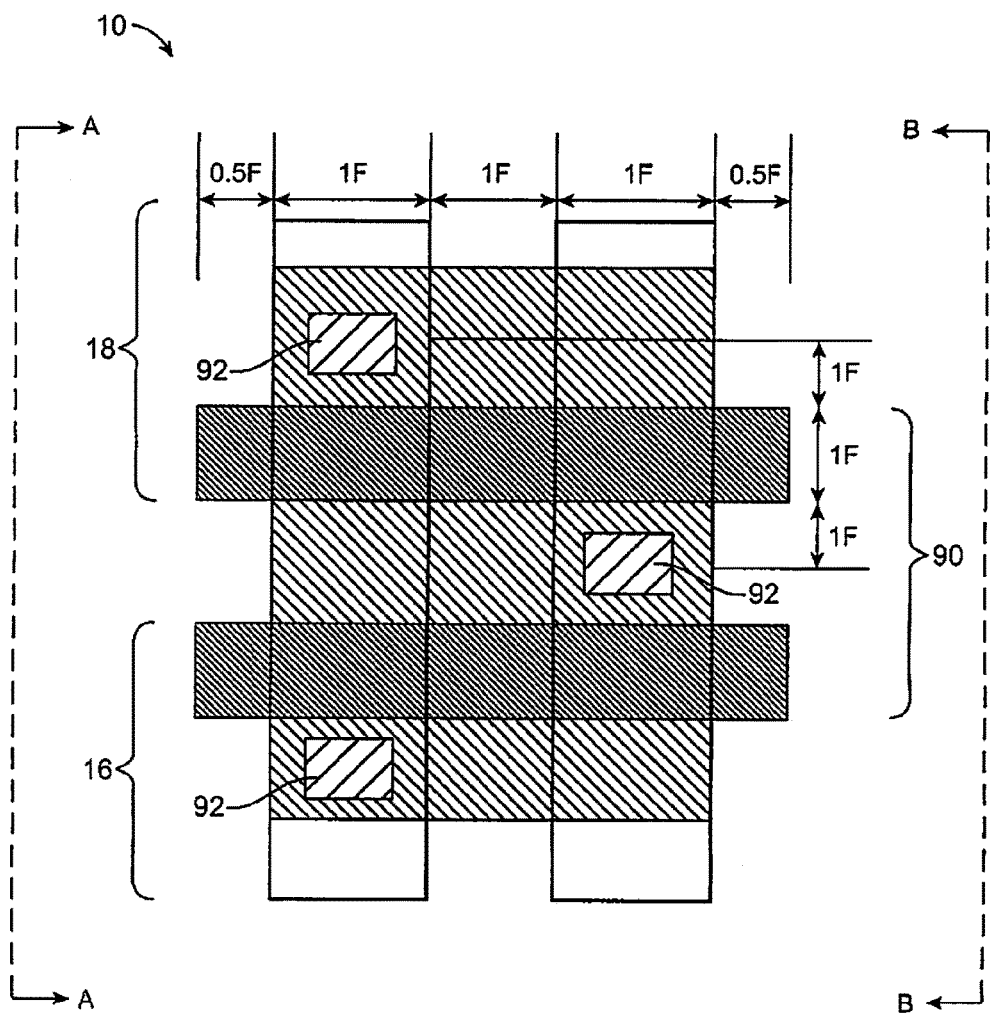
FIG. 5 shows a plan view of some of the MTJs and transistors of FIG. 3.

Referring now to FIG. 5, a plan view of a shared 2 transistor and 1 MTJ (or S2T1J) configuration, as discussed above relative to FIGS. 1-4 above, is shown.

In accordance with an embodiment of the present invention, the minimum cell width of a cell of array 10 is 4F ('F' being feature) and a minimum cell length thereof is 3F and the minimum cell size is therefore approximately $12F^2$ or 3F×4F. The minimum cell width includes a 1F spacing to allow 0.5F for space on each side of the cell and 3F for the cell itself. Minimum cell length is 3F because of 1F spacing is needed with 0.5F per side of the cell. The minimum transistor width is 3F times 2 or approximately 6F, which is advantageously six times greater than prior art cells. Greater transistor width allows for greater switching current density (Jc), which is desirable due to great technical challenges to lower Jc and maintain a smaller cell size. This approach requires less constraint on Jc.

Using a 65 nanometer process lithography, and a minimum transistor width of 6F, Jc can advantageously allow under 3 mega amps per squared centimeter, which is well higher than the current 1 mega amp per squared centimeter targeted by prior art techniques.

Figure 6:
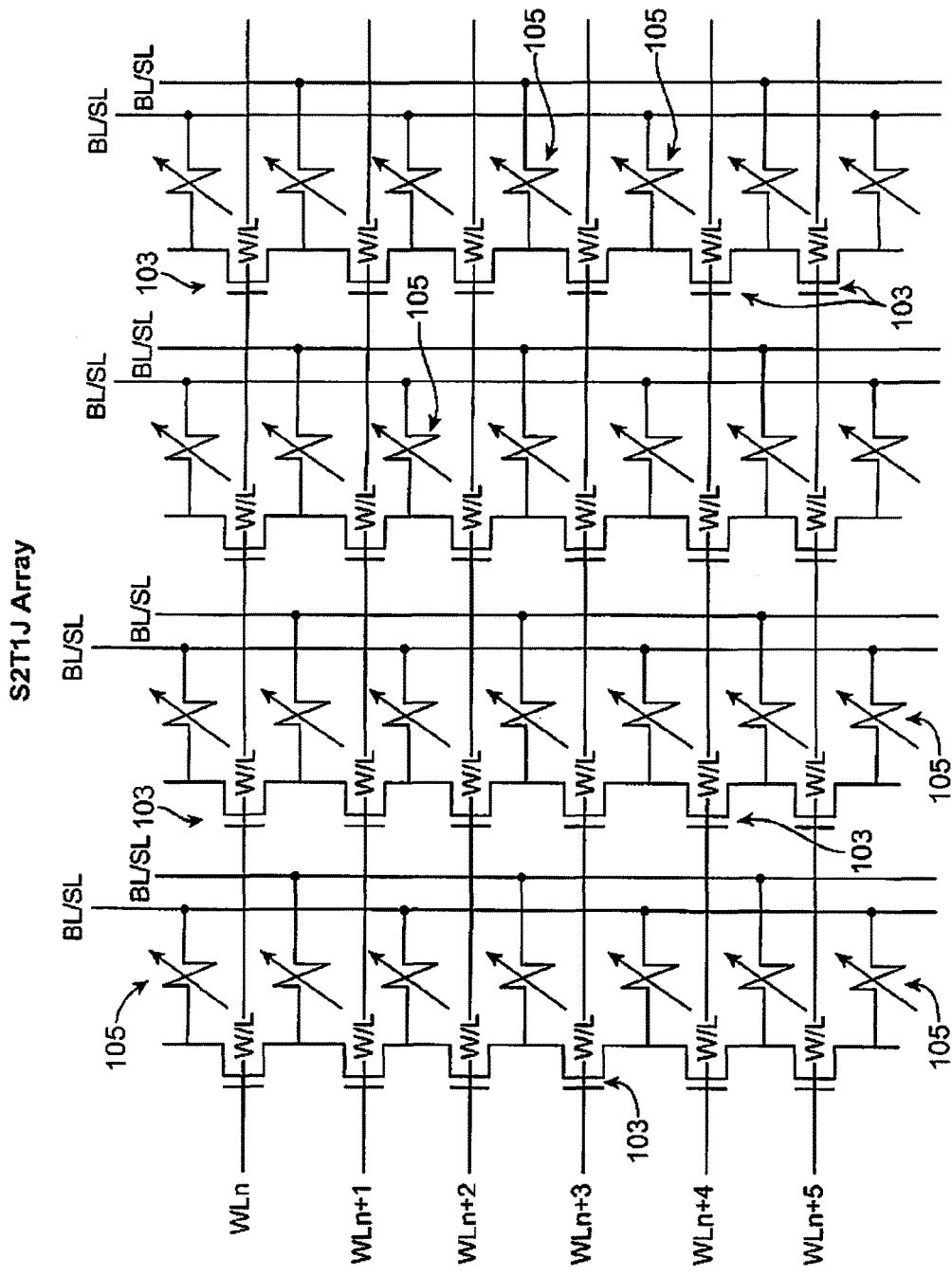
FIG. 6 shows the array 10 in yet another schematic form, showing a more comprehensive layout than FIG. 3.

FIG. 6 shows the array 10 including additional MTJs and transistors. Namely, an array of rows and columns is shown to include 28 MTJs 105 and 24 transistors 103. It is noted that the sharing of source lines with bit lines (bit/source line 12 and bit/source line 14) contributes to advantageously decreasing the size of array 10, because the cells maintain around $12F^2$ cell size, and are associated with a higher Jc. This is advantageous in comparison to the prior art memory cell arrays which require increased size, growing larger than about $25F^2$, to maintain the same Jc as the embodiments of the present invention disclosed above. Accordingly, array 10 or any other similar embodiment where the bit and source lines are shared is an attractive candidate for replacement of conventional memory, such as in handheld devices and other consumer goods as well as other products.

Figure 7:
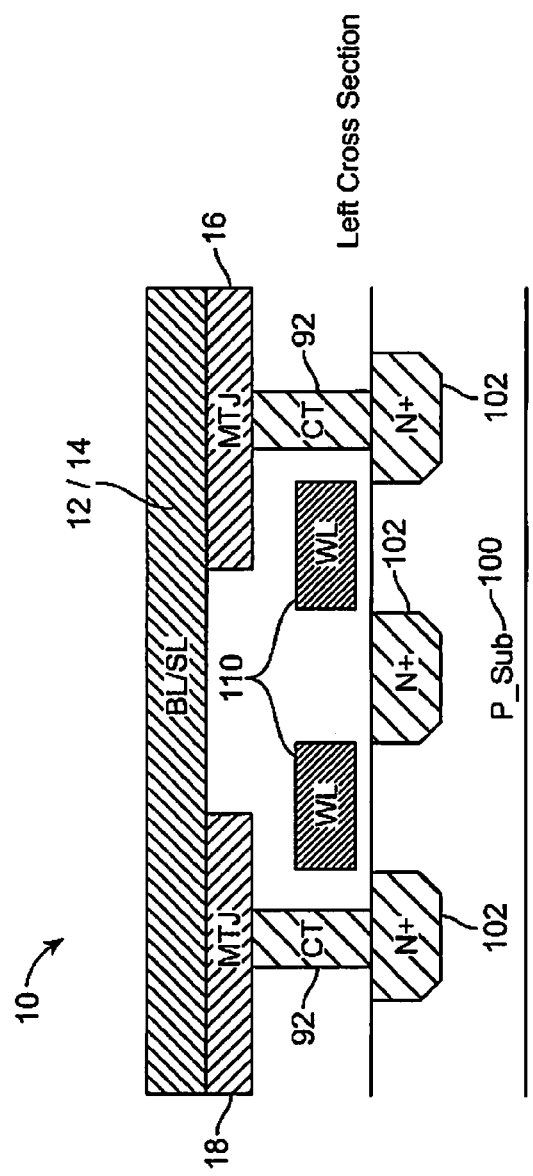
FIG. 7 shows a cross-sectional view of the plan view drawing of array 10 of FIG. 5 looking into FIG. 5 from the left side of the figure.
Figure 8:
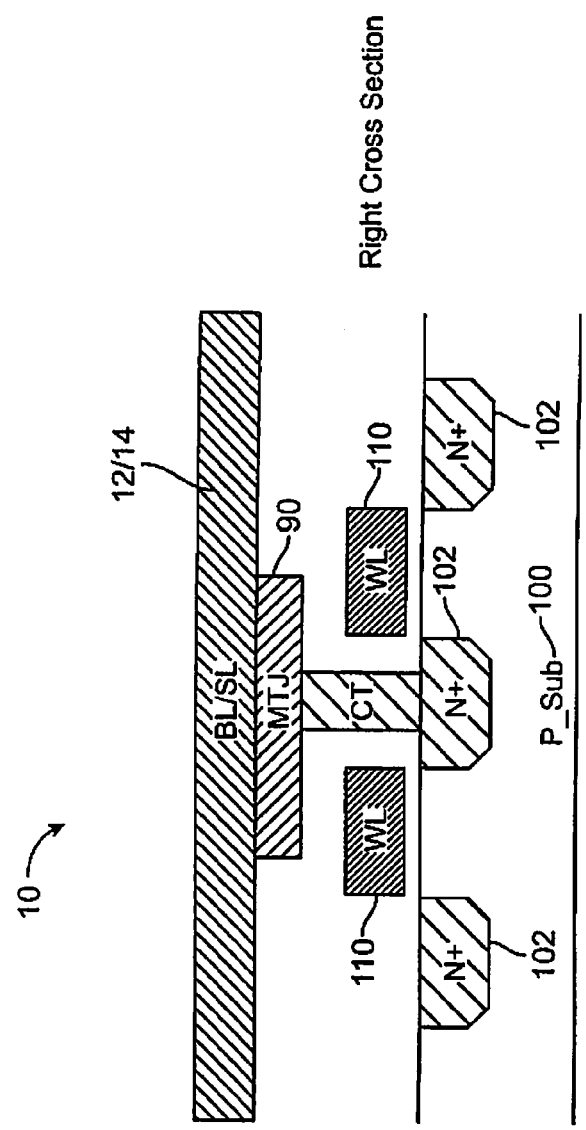
FIG. 8 shows a cross-sectional view of the plan view drawing of array 10 of FIG. 5 looking into FIG. 5 from the right side of the figure.

Referring now to FIGS. 7 and 8, cross-sectional views of array 10 of FIG. 5 are shown. FIG. 8 shows a cross-sectional view of the plan view drawing of array 10 of FIG. 5, looking into FIG. 5 from view AA. Accordingly, MTJs 16 and 18 are visible. FIG. 8 shows a cross-sectional view of the plan view drawing of array 10 of FIG. 5, looking into FIG. 5 from view BB. Accordingly, MTJ 90 is visible.

As shown in FIGS. 7 and 8, N+ doped regions 102 are formed in a P-substrate 100. Upon the N+ doped regions 102 are formed contacts 92, and on top of each contact 92 is formed an MTJ (MTJs 16, 18, and 90 are shown). Upon each of the MTJs is formed a bit line/source line 12 or 14. As previously discussed, bit/source line 12 and bit/source line 14 are formed in a manner so that they are connected in an alternating fashion to neighboring MTJs. The contacts 92 couple the transistors to the MTJs. The word lines 110 are formed between and on top of the N+ doped regions 102, and form the gate of the transistors. The transistors are formed in the P substrate 100 and include the N+ doped regions 102.

Figure 9:
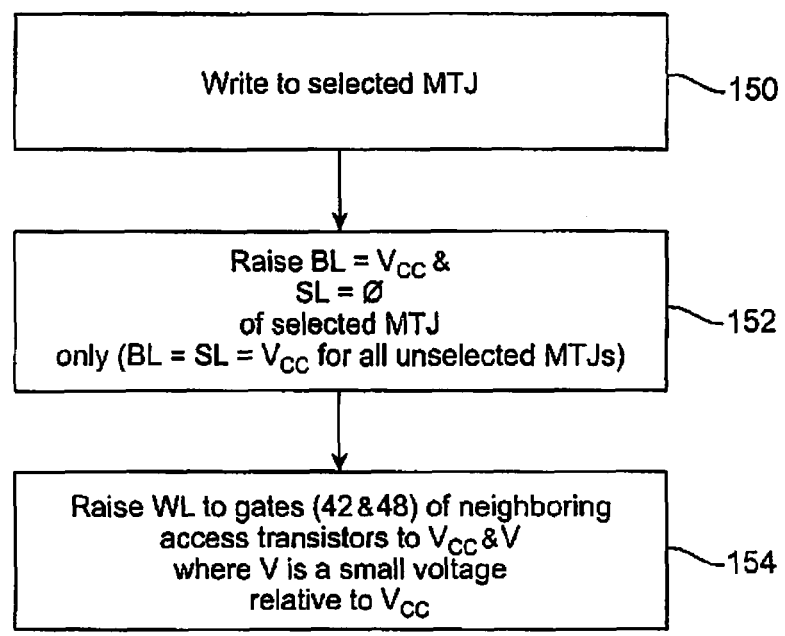
FIG. 9 shows a flow chart of some of the steps performed when writing to a selected ("select") MTJ, in accordance with a method of the present invention.

FIG. 9 shows a flow chart of some of the steps performed when writing to a selected ("select") MTJ, in accordance with a method of the present invention. At step 150, a write operation to write to a selected MTJ, using the forward action as shown in FIG. 2, is initiated. Forward action is determined by the logic value being written, as is reverse action. For the sake of example, forward action is discussed now.

By way of example, the selected MTJ is MTJ 16 of FIG. 2. Next, referring to FIG. 2, the BL 14 is raised to a voltage that is substantially equal to Vcc and the SL 12 is set to a voltage that is substantially equal to 0 volts. It is important to note that the foregoing BL and SL voltage settings only refer to the selected MTJ 16 and none others. That is, the BL and SL of all unselected MTJs are set substantially equal to Vcc. This advantageously avoids stress on the gates of the access transistors corresponding to unselected MTJs thereby increasing reliability.

Next, at step 154, the WLn+1 at gate 42 and WLn+2 at gate 48 of the neighboring access transistors to the MTJ 16 are raised to a voltage level that is substantially Vcc+V where V is a small voltage relative to Vcc. In one embodiment of the present invention, the V is approximately 0.5V.

Due to the forward action, current flows from the BL 14 through the MTJ 16 and the transistor 24 and the MTJ 18 to the SL 12. The current flowing through the transistor 24 is at a level that is higher (more drive current, IDS) than prior art techniques due to the voltage at the gates of the transistors 24 and 26 being raised as discussed above. The current increase through the transistor 24 is approximately 10% per every tenth of a volt increase in gate voltage higher than those experienced with prior art techniques.

The foregoing voltage settings and configuration effectively and advantageously avoid electrical specification violations of a transistor where the transistors 24 and 26 are concerned. That is, rather than the typical specification requirement of the gate voltage of these transistor being approximately 1.2V, it is approximately 1.7V or 0.5 volts higher than the specification requirements, and the voltage at the drain of these transistors is approximately 0.5V rather than the typical 0 volts and the voltage at the source of these transistors is approximately 1.2V rather than 0.7V.

In the case of reverse action, SL 14 of FIG. 1 is set to Vcc and BL 12 is set to zero volts. In the figures shown herein, it is noted that the BL 14 in the forward action is the same line or physical wire as the SL 14 in the case of reverse action and the BL 12 in the case of reverse action is the same physical line as the SL 12 in the case of forward action. That is, 14 is either SL or BL depending on the value being written, similarly, 12 is either SL or BL depending on the value being written.

Use of fixed numbers is no indication of being limited to the fixed numbers. The figures are not drawn to scale and the thickness of the lines is no indication of the size indicated by the lines.

Figure 10:
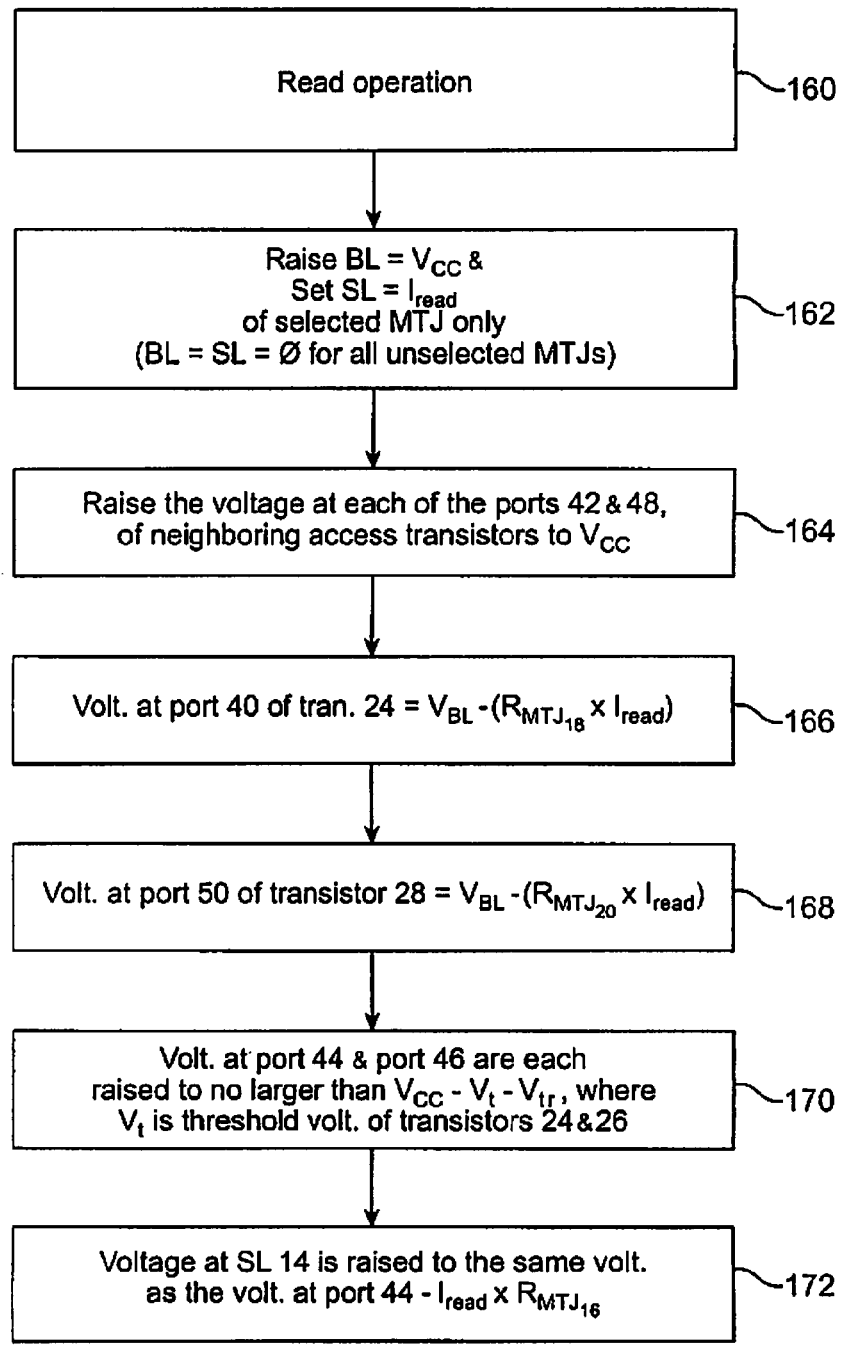
FIG. 10 shows some of the steps performed during a read operation of a selected MTJ, in accordance with a method of the present invention.

FIG. 10 shows some of the steps performed during a read operation of a selected MTJ, in accordance with a method of the present invention. At step 160, the read operation is initiated to read a selected MTJ, such as the MTJ 16. It is noted that in one embodiment of the present invention, all read operations are performed as forward action because there is no need for basing the direction of current on the value being written such as in the case of write operations. Alternatively, the reverse action may be employed to read but there is no need to use both the reverse and the forward actions, as in the case of the write operation. In the discussion and example to follow, reverse action is employed.

Next, at step 162, BL 14 is raised to be approximately the same value as Vcc and SL 12 is set to approximately have a current level required for reading MTJ 16, Iread, flow therethrough. BL 14 and SL 12 for all unselected MTJs, such as but not limited to MTJs 18 and 20 are set to or remain at approximately 0V, which advantageously reduces the stress on the unselected MTJs thereby lengthening their lifetime and/or increasing reliability of the memory array. Next, at step 164, the voltage at each of the ports 42 and 46 is raised to Vcc+V. Next, at step 166, the voltage at the port 40 of the transistor 24 becomes the voltage at BL 14, $V_{BL}$, minus the resistance of MTJ 18 times Iread or $V_{BL}-(R_{MTJ18} \times Iread)$ and, at step 168, the voltage at the port 50 of the transistor 26 becomes $V_{BL}$ minus the resistance of MTJ 20 times Iread or $V_{BL}-(R_{MTJ20} \times Iread)$.

Next, at step 170, the voltage at each of the gates 44 and 46 is raised to be no larger than Vcc−Vt−Vtr and maintained at this level, where Vt is the threshold voltage of each corresponding transistors 24 and 26 and Vtr is the voltage drop across each of the transistors 24 and 26. Next, at step 172, the voltage at SL 14 is raised to the same voltage as the voltage at gate 44 minus Iread times the resistance of MTJ 16 or $V_{gate44}-Iread \times R_{MTJ16}$. In this manner, the MTJ 16's state is determined by sensing the voltage of SL 14 in the case where reverse action is used to read and then the voltage of SL 14 is compared to a reference voltage to determine the logic state of the MTJ 16.

This process is perhaps better understood by way of an example where Vcc is 1.2V, $R_L$ is 1K Ohms, $R_H$ is 3K Ohms, Iread is 20 micro Amps and Vt is 0.3V. Given these exemplary values, the following voltages are experienced at indicated ports during reading of MTJ 16.

$$V\text{port40}=Vcc-(R_H \times Iread)=1.2V-(3 \text{ K Ohms} \times 20 \text{ micro Amps})=1.14V \text{ for } R_H \quad \text{Eq. (1) or}$$

$$V\text{port40}=Vcc-(R_L \times Iread)=1.2V-(1 \text{ K Ohms} \times 20 \text{ micro Amps})=1.18V \text{ for } R_L \quad \text{Eq. (2)}$$

Where Vport40 is the voltage at port 40.

$$V\text{port28}=Vcc-(R_H \times Iread)=1.2V-(3 \text{ K Ohms} \times 20 \text{ micro Amps})=1.14V \text{ for } R_H \quad \text{Eq. (3) or}$$

$$V\text{port28}=Vcc-(R_L \times Iread)=1.2V-(1 \text{ K Ohms} \times 20 \text{ micro Amps})=1.18V \text{ for } R_L \quad \text{Eq. (4)}$$

Where Vport28 is the voltage at port 28.

$$V\text{port44}=Vcc-Vt-Vtr=1.2V-0.3V-0.3V=0.6V \quad \text{Eq. (5)}$$

Where Vport44 is the voltage at port 44 and Vtr is the voltage drop across the transistor 24.

$$V_{SL14}=V\text{port44}-(R_{MTJ18} \times 20 \text{ micro Amps})=0.6V-(R_{MTJ18} \times 20 \text{ micro Amps})=0.6V-(1 \text{ K Ohms} \times 20 \text{ micro Amps})=0.58V \text{ for } R_L \text{ or } 0.6V-((3 \text{ K Ohms} \times 20 \text{ micro Amps})=0.54V \text{ for } R_H \quad \text{Eq. (6)}$$

Where $V_{SL14}$ is the voltage at SL 14.

The voltage at SL 14, or $V_{SL14}$, is accordingly sensed to read the state of MTJ 18 because in accordance with Eq. (6), it is based on the resistance of MTJ 18.

The reference voltage, which is subsequently used to compare to the $V_{SL14}$ to determine the logic state of MTJ 16, is designed to have a value that is in between the $V_{SL14}$ for $R_H$ and the $V_{SL14}$ for $R_L$, in this case 0.54 to 0.58V. In this example, an appropriate level for the reference voltage would be 0.56V.

Figure 11:
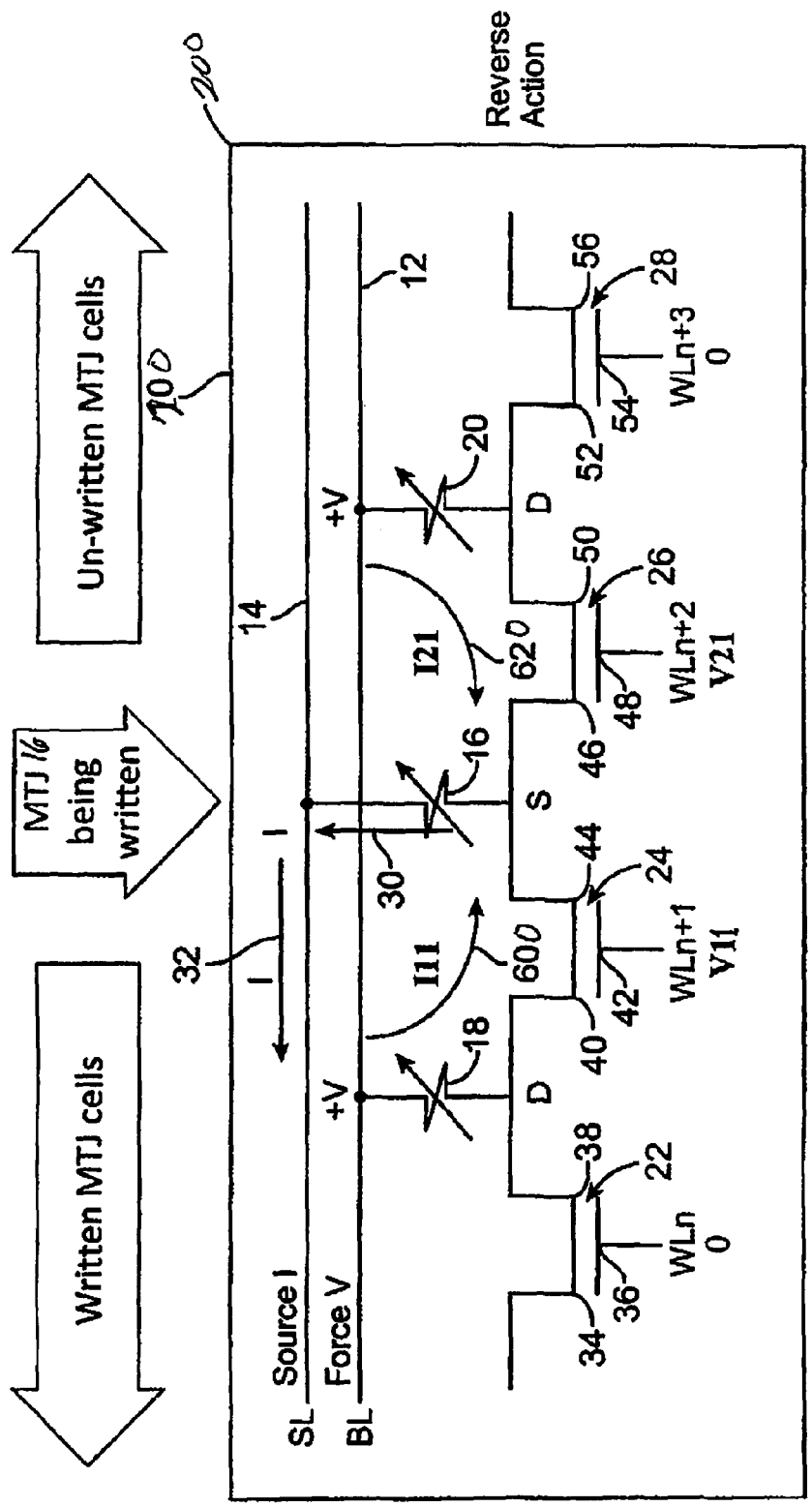
FIG. 11 shows a portion of a STTMRAM array 200 in accordance with another embodiment of the present invention.

Referring now to FIG. 11, a portion of a STTMRAM array 200 is shown, in accordance with another embodiment of the present invention. The array 200 is analogous to the array 10 except that the currents flowing through neighboring transistors 24 and 26 are different, and the method of writing an array of MTJs is different, in addition to the structural differences discussed below.

In the embodiment of FIG. 11, the MTJs in the array 200 are written to sequentially, for instance in the embodiment of FIG. 11, from the transistors with a lower reference number to transistors with higher numbers. Specifically, in an exemplary embodiment, such as shown in FIG. 11, the MTJ 16, is the MTJ being written (programmed) and the MTJ 18 and other MTJs to the left of the MTJ 18 (not shown in FIG. 11) are previously written while the MTJ 20 with other MTJs to the right of the MTJ 20 (not shown in FIG. 11) are not yet written. Sequential writing is performed by writing to the MTJ 16, after the MTJ 18 is already written to, followed by the MTJ 20 being written to, and so on and so forth. Accordingly, MTJs are written in sequential order relative to neighboring MTJs. Otherwise, the method of writing to each MTJ of the array 200 remains the same and is consistent with that which is described above relative to previously-discussed embodiments.

In terms of structural differences between the embodiment of FIG. 1 and FIG. 11, the primary difference lies in the voltages at V11 and V21 applied on WLn+1 (at the gate 42) and WLn+2 (at the gate 48), respectively, in that these two voltages are different. This is due to the current, I11, shown by the arrow 600 in FIG. 11, which is supplied by the transistor 24 and flows through the MTJ 18, and the current I21, shown by the arrow 620 in FIG. 11, which is supplied by the transistor 26 and flows though the MTJ 20 being different in FIG. 11 than in FIG. 1 in the following manner.

In contrast to the embodiment of FIG. 1, in the embodiment of FIG. 11, the current flowing through a neighboring MTJ that has been previously written is typically and desirably much smaller than the current flowing through a neighboring MTJ that has not yet been written, which means I11<I21 because MTJ 18 has been previously written yet MTJ 20 has not.

In some embodiments, the current I21 is the maximum write current that the transistor 26 can supply, while the current I11 supplied by the transistor 24 and passing through the MTJ 18 is substantially at the same level (or "amplitude") as that of a read operation of the MTJ 18. In this case, the total current (I) flowing through the MTJ 16 that is currently being written, is the combination of the currents I11 and I21, or I=I21+I11. I21 is the maximum write current a typical neighboring transistor can generate, and the I11 is the read current. The write current through the MTJ 16 is boosted to be higher than the maximum write current a single transistor can supply by an amount that is approximately the current level during a read operation.

For typical STTMRAM designs, the read current through an MTJ is generally 10~20% of the write current required to switch the MTJ. Thus, a boost of switching current in the MTJ 16 can be 10~20%. With I21 being larger than I11, V21 (at gate 48) is generally larger than V11 (at gate 42) in typical transistor designs and operation.

In summary, in accordance with the embodiment of FIG. 11, when writing to a given MTJ, the MTJs are written sequentially, and the current flowing through the neighboring MTJ cell that has been written previously is lower than the current flowing through the neighboring MTJ cell that has not yet been written. In some embodiments, the current through the written MTJ cell is less than 25%, and can be 10% to 20%, of the current through un-written MTJ cell. The current through the un-written cell can be the maximum current a typical transistor can supply.

In contrast to the embodiment of FIG. 1, in the embodiment of FIG. 11, during the writing of a MTJ cell, the neighboring MTJ cell that is previously written only experiences read disturbance due to the low read current flowing therethrough. For a typical STTMRAM design, read disturbance during a read operation is much less of concern than the 50% power write disturbance typically experienced by the embodiment of FIG. 1 by the neighboring MTJ cells. While for the neighboring cell that is not yet written in FIG. 11, the MTJ experiences the full amplitude write disturbance, because the MTJ is not yet written and is due to be written in a next writing operation, such write disturbance advantageously poses no concern as well.

Comparing to other prior art conventional one-transistor one-MTJ design, the embodiment of FIG. 11 can easily help boost the write current through MTJ during writing by 10~20% more than maximum current available through a single transistor. As the write current distribution of MTJ cells from a typically well designed STTMRAM is generally having a distribution tail that is within 20% of the median value of the distribution, the enhancement write current as in FIG. 11 can significantly reduce the population of the tail bits that are harder to write than normal bits. In turn, the tail bit reduction can help increase the overall bit yield and wafer yield of STTMRAM, and reduce the required complexity of error-correction-handling, and, most notably, help enhance the performance of the STTMRAM and reduce overall cost of manufacturing a device made of STTMRAM. Additionally, by increasing the write margin, more freedom is experienced in designing the MTJ with increased tolerance for a higher thermal stability and harder-to-write MTJ design leading to satisfying more application purposes.

Alternatively, the current I11 may be in the form of a pulse having a pulse width or period narrower than that of the current I21. At narrower pulse width, the current I11 may have a pulse amplitude higher than approximately 10-20% of the maximum write current from transistor to attain the same effect on the MTJ 16 while avoiding write disturbance of the written MTJ 18. In an extreme case, the current I11 may have an amplitude that is comparable to or even higher than that of the I21 without write disturbance of the MTJ 18 because the current I11 has a correspondingly narrower pulse width. Since the MTJ 20 has not yet been written, the current I21 with a typical maximum allowable pulse width during writing of the MTJ 16 is capable of switching the state of the MTJ 20. Therefore, the total current 30 flowing into the MTJ 16 during writing is the sum of a narrow width current pulse I11 and a wide width current pulse I21, which effectively appears as a current pulse with an overshoot above the wider width pulse level. The current I11 with a narrower pulse width and the current I21 with a wider pulse width may not have the same pulse starting time during writing of the MTJ 16. In fact, the current pulse I11 may partially or entirely overlap with the wider current pulse I21.

Figure 12:
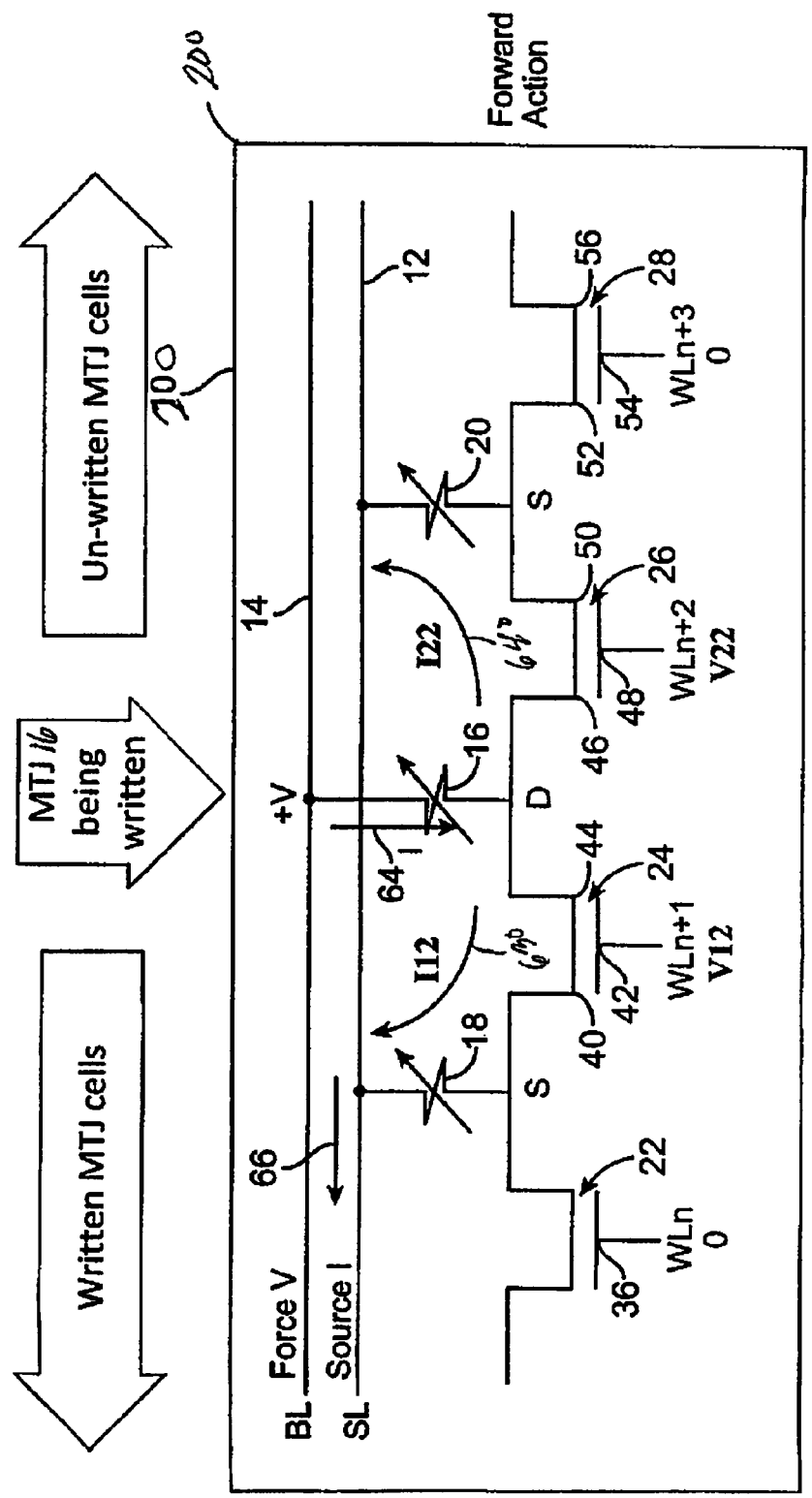
FIG. 12 shows the array 200 with the flow of the switching current through the MTJ 16 being in a direction opposite to that of the MTJ 16 shown in FIG. 11.

FIG. 12 shows the array 200 with the flow of the switching current through the MTJ 16 being in a direction opposite to that of the MTJ 16 shown in FIG. 11. The flow of the switching current through the MTJ 16, in FIG. 11, is referred to herein as the "reverse action" while the flow of the switching current through the MTJ 16, in FIG. 12, is referred to herein as the "forward action".

The embodiment of FIG. 12 is analogous to that of FIG. 2, except that the currents flowing through neighboring transistors 24 and 26 are different in these two embodiments, and the method of writing to an array of MTJs is similarly different. The difference of operation of the embodiment of FIG. 12 as opposed to the embodiment of FIG. 2 is the same as that of the difference between the embodiments of FIG. 11 and FIG. 1 in the following manner.

For the sake of assumption, as done for prior embodiment, the MTJ 18 is written previously, the MTJ 20 is not yet written, and the MTJ 16 is currently being written. I22, shown by the arrow 640 in FIG. 12, flows through the MTJ 20, I12, shown by the arrow 630 in FIG. 12, flows through the MTJ 18, V12, shown at the gate 42 in FIG. 12, and V22 shown at the gate 48, are at the following relative levels: I22>I12, V22>V12, and I12<25% of I22 and preferably I12 is 10~20% of I22 with I22 being the maximum write current that the transistor 26 can supply and I12 being at a read current level. It is understood that current "levels" or voltage "levels" as used herein also refer to current "amplitudes" or voltage "amplitudes", respectively, and "current" refers to current level or current amplitude as "voltage" refers to voltage level or voltage amplitude. For example, "I22" refers to a current level or current amplitude and "V22" refers to a voltage level or voltage amplitude.

Figure 13:
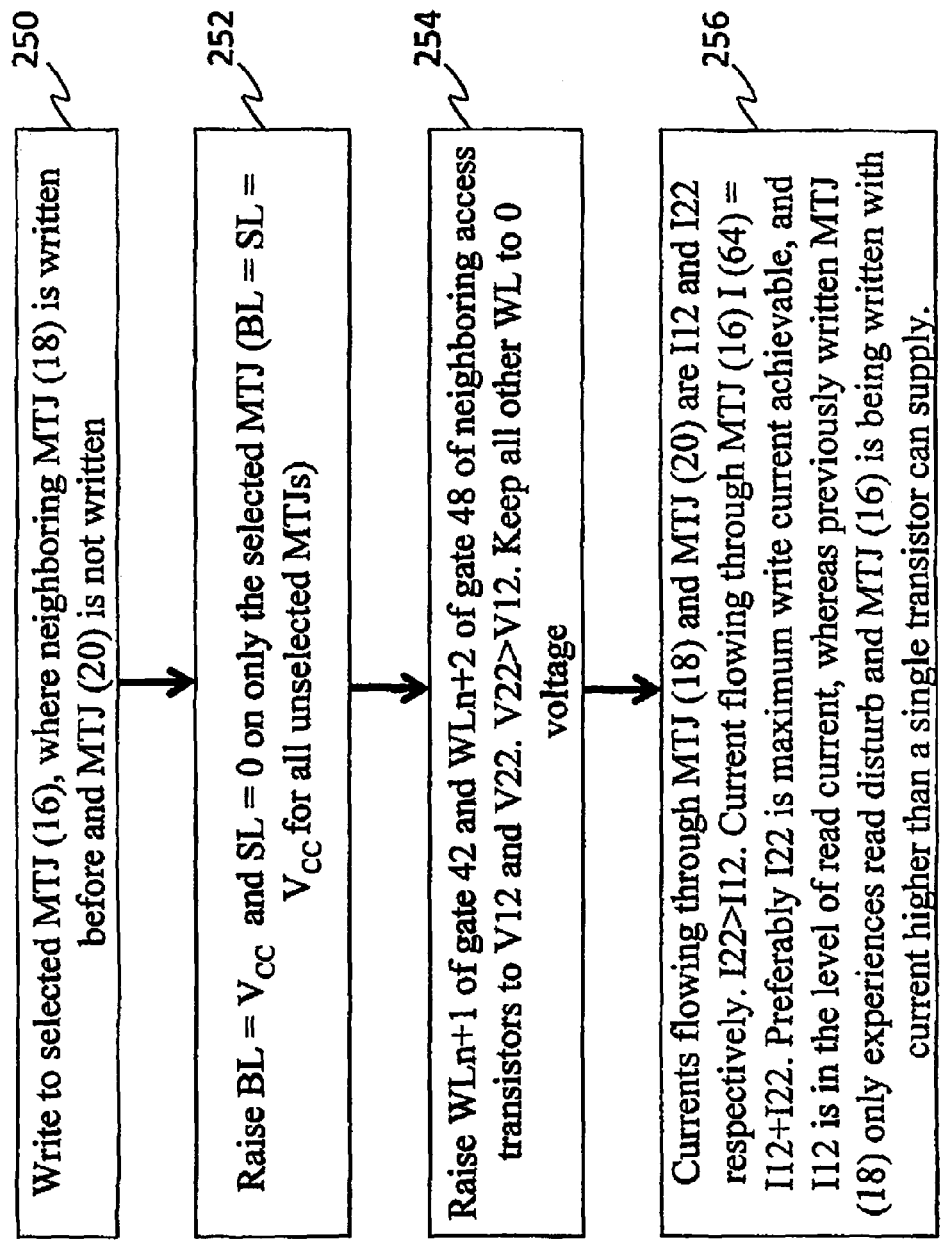
FIG. 13 shows a flow chart of some of the steps performed when writing to a selected MTJ, in accordance with a method of the present invention employing the embodiment of FIG. 12.

FIG. 13 shows a flow chart of some of the steps performed when writing to a selected MTJ, in accordance with a method of the present invention employing the embodiment of FIG. 12. In FIG. 13, at step 250, a write operation to write to a selected MTJ, such as the MTJ 16, using the forward action as shown in FIG. 12, is initiated. Forward action is determined by the logic value being written, as is reverse action. To illustrate an example, forward action is now discussed. While writing to the MTJ 16, it is noted that the MTJ 18 is previously written and MTJ 20 is not written, due to sequential writing, as discussed above.

Next at step of 252, by way of example, the selected MTJ, i.e. the MTJ 16 of FIG. 12 is to be written to and the BL 14 is raised to a voltage that is substantially equal to Vcc and the SL 12 is set to a voltage that is substantially equal to 0 volts. It is important to note that the foregoing BL and SL voltage settings only concern the selected MTJ 16 and no other MTJ of the array 200. That is, the BL and SL of all unselected MTJs of the array 200 are set substantially equal to Vcc. This advantageously avoids stress on the gates of the access transistors corresponding to unselected MTJs thereby increasing reliability.

Next, at step 254, the WLn+1 at gate 42 and WLn+2 at gate 48 of the neighboring access transistors to the MTJ 16 are raised to voltage levels of V12 and V22 respectively, with the voltage level of V22 being greater than that of V12, i.e. V22>V12, while WL of the rest of the access transistors in the array 200 is kept at 0 volt.

Next, at step 256, due to the forward action, current flows from the BL 14 through the MTJ 16, and through the transistor 24 and the MTJ 18, as well as though the transistor 26 and the MTJ 20, to the SL 12. Current through the MTJ 16 is substantially equal to the summation of the current through the MTJ 18 and the MTJ 20. With V22>V12, current flowing through the transistor 26 and the MTJ 20 is larger than the current flowing through the transistor 24 and the MTJ 18. By making current, I12, through the MTJ 18, which remains written, be equal or less than the typical read current through a typical MTJ, the MTJ 18 only experiences read disturb, while the MTJ 16 is written with combined current higher than a single transistor can supply.

In the case of reverse action, the SL 14 of FIG. 11 is set to Vcc and the BL 12 is set to zero volts. In the figures shown herein, it is noted that the BL 14 in the forward action is the same line or physical wire as the SL 14 in the case of reverse action and the BL 12 in the case of reverse action is the same physical line as the SL 12 in the case of forward action. That is, the physical wire that is referenced by "14", in FIG. 11, is either SL or BL depending on the value being written, similarly, the physical wire that is referenced by "12" is either SL or BL depending on the value being written.

As used herein, use of fixed numbers is no indication of being limited to the fixed numbers. The figures are not drawn to scale and the thickness of the lines is no indication of the size indicated by the lines.

FIGS. 11, 12, and 3 focus on the case where the currents I21 and I22 are high enough to switch a vast majority population (>95%) of MTJs in a given STTMRAM array 10, and I11 and I12 are preferred to be in the read current level to avoid too much disturbance on the magnetization state of the neighboring already-written MTJ 18 when writing to the MTJ 16 (currently selected for writing). However, in STT-MRAM designs where a single transistor maximum current is not high enough to switch the state of as many of the MTJs as suitable for a memory array, the I11 and I12 can be within the range of substantially larger than 0% and less than 100% of the I21 and I22 during writing of the MTJ 16, as long as the combined current, i.e. (I11+I21) and (I12+I22), are suitable to effect writing of the MTJ 16 with practically acceptable confidence, while I11 or I21 do not by themselves produce practically unacceptable disturbance on the MTJ 18. Thus, with the method of sequential writing, and the MTJ 18 being the written MTJ, the MTJ 20 being the un-written MTJ, and the MTJ 16 being currently written upon, the requirement in this case is that I21 and I22 are maximum currents that the transistor 26 can produce, and I11<I21, I12<I22.

Alternatively, the currents I11 and I12 may be in the form of a pulse having a pulse width or period narrower than that of the current I21 and I22, respectively. At narrower pulse widths, the currents I11 and I12 may have higher pulse amplitudes than approximately 10-20% of the maximum write current from transistor to attain the same effects on the MTJ 16 while avoiding write disturbance of the written MTJ 18. In an extreme case, the currents I11 and I12 may have amplitudes that are comparable to or even higher than those of the currents I21 and I22, respectively, without write disturbance of the MTJ 18 because the currents I11 and I12 have correspondingly narrower pulse widths than the currents I21 and I22. Since the MTJ 20 has not yet been written, the currents I21 and I22 with a typical maximum allowable pulse width during writing of the MTJ 16 are capable of switching the state of the MTJ 20. Therefore, the total current 30 or 64 flowing into the MTJ 16 during writing is the sum of a narrow width current pulse I11 or I12 and a wide width current pulse I21 or I22, which effectively appears as a current pulse with an overshoot above the wider width pulse level. The current I11 or I12 with a narrower pulse width and the current pulse I21 or I22 with a wider pulse width may not have the same pulse starting time during writing of the MTJ 16. In fact, the current pulses I11 and I12 may partially or entirely overlap with the wider current pulses I21 and I22, respectively.

Figure 14:
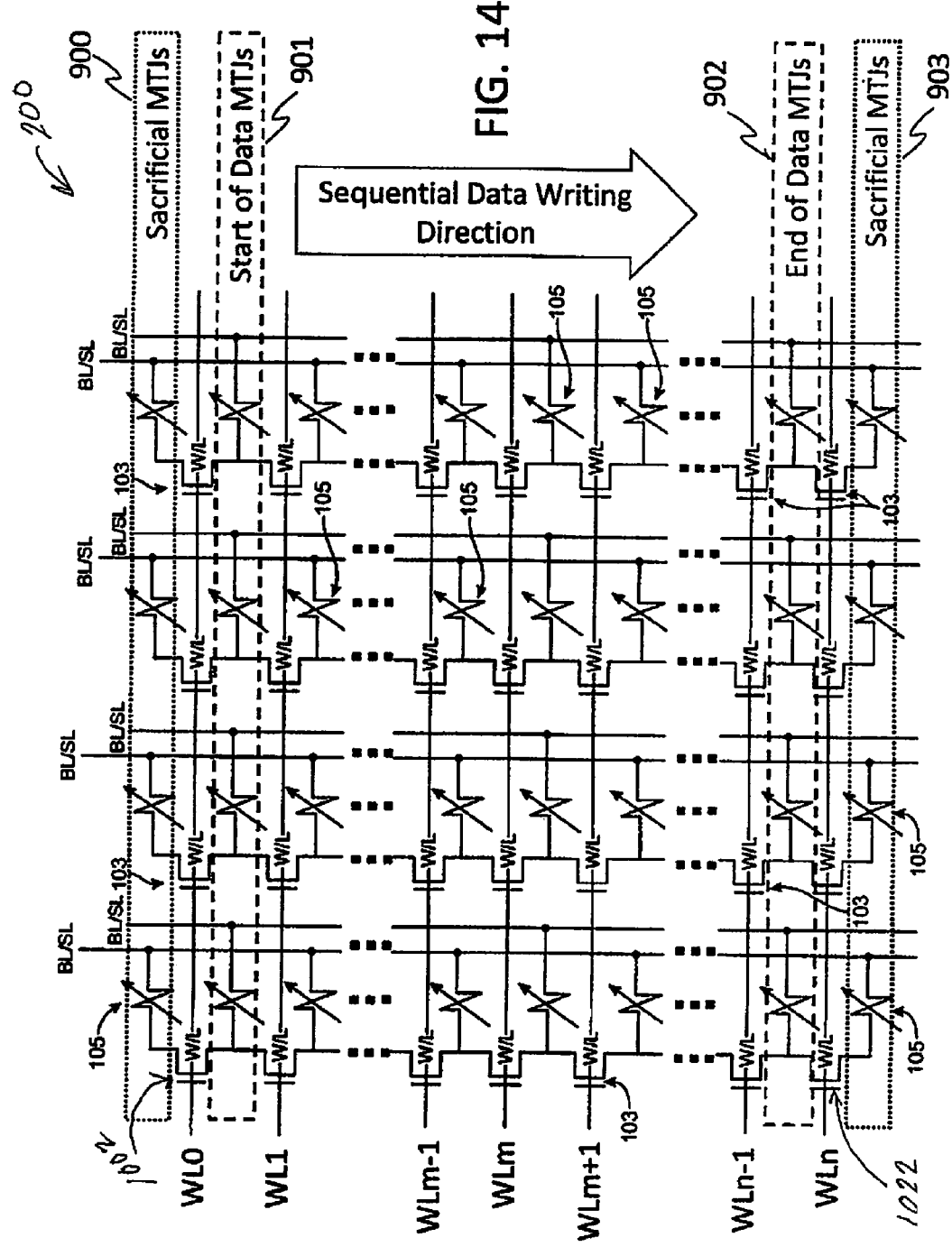
FIG. 14 shows the array 200 in another schematic form, showing a more comprehensive layout than shown in FIGS. 11 and 12.

FIG. 14 shows the array 200 in another schematic form, showing a more comprehensive layout than shown in FIGS. 11 and 12 in that the array 200 is shown to include additional MTJs and transistors. The array 200, in the vertical direction, includes all that is shown as the array 200, starting from the transistor 1002, having its gate coupled to the WL0, through the transistor 1022 having its gate coupled to the WLn, with 'n' indicating an integer. In the longitudinal direction, for the sake of simplicity, only four (4) columns of vertical arrays are shown included as a part of the array 200. Sequential writing of each vertical array of MTJs starts from WL0 and WL1, whose transistors write the row of MTJs circled by dashed box 901 as the Start-of-Data MTJs, and ends at WLn−1 and WLn, whose transistors write the row of MTJs circled by dashed box 902 as the End-of-Data MTJs. For the MTJs circled by the dashed box 900 above the box 901 and MTJs circled by the dashed box 903 below the box 902, since they are at the very ends of the vertical array and only have one neighboring MTJ and transistor, they may not be sufficiently written with a single transistor current and are therefore labeled as Sacrificial MTJs in FIG. 14. The Sacrificial MTJs are not regarded as data bits of STTMRAM.

Figure 15:
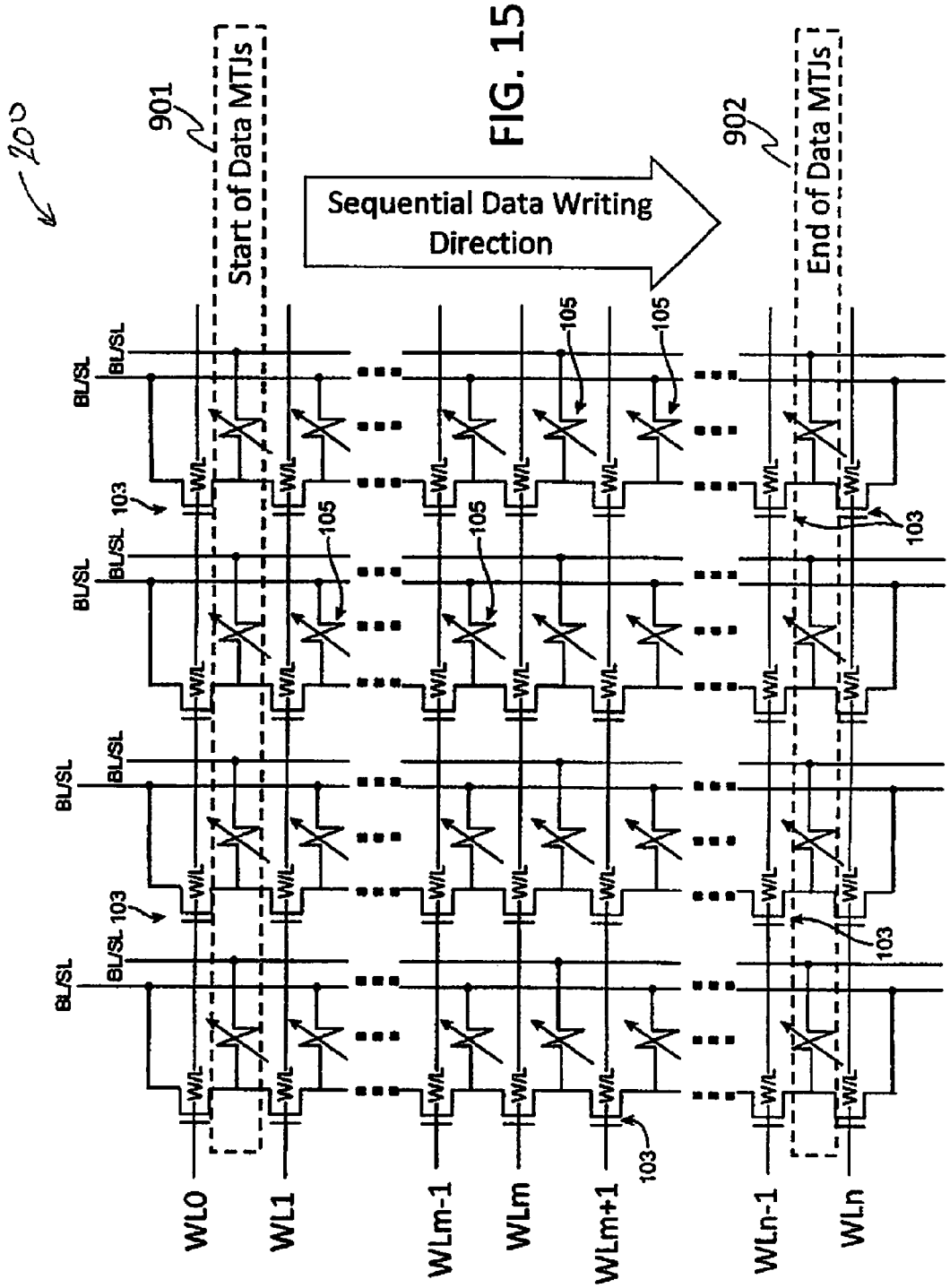
FIG. 15 shows the array 200 in yet another schematic form, showing a more comprehensive layout than shown in FIGS. 11 and 12.

FIG. 15 shows the array 200 in yet another schematic form, showing a more comprehensive layout than shown in FIGS. 11 and 12. In the embodiment of FIG. 15, additional MTJs and (access) transistors are shown. The primary difference between the embodiments of FIGS. 15 and 14 is that the top and bottom Sacrificial MTJs of FIG. 14 are replaced with direct electrical connections, preferable through VIAs during manufacturing process, as in FIG. 15.

During a read operation, the embodiments of FIGS. 11 to 15 behave analogously to the embodiments of FIGS. 1 to 10.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin-transfer torque magnetic random access memory (STT-MRAM) array comprising:
   a selected magnetic tunnel junction (MTJ) to be programmed by switching state thereof upon application of a switching current, said selected MTJ being directly coupled to first and second transistors;
   a first neighboring MTJ directly coupled to said first transistor; and
   a second neighboring MTJ directly coupled to said second transistor,
   wherein during programming of said selected MTJ, a first current flows through said first neighboring MTJ and said first transistor and a second current flows through said second neighboring MTJ and said second transistor,
   wherein said first current has a first pulse width that is narrower than a second pulse width of said second current.

2. The STT-MRAM array of claim 1, wherein said first current is less than said second current.

3. The STT-MRAM array of claim 1, wherein said first neighboring MTJ has been programmed prior to programming of said selected MTJ.

4. The STT-MRAM array of claim 1, wherein said second neighboring MTJ has not been programmed prior to programming of said selected MTJ.

5. A spin-transfer torque magnetic random access memory (STT-MRAM) array comprising:
   a selected magnetic tunnel junction (MTJ) to be programmed by switching state thereof upon application of a switching current, said selected MTJ having first and second ends;
   a first transistor having first and second ports, said first port of said first transistor being directly coupled to said first end of said selected MTJ;
   a first neighboring MTJ having first and second ends, said first end of said first neighboring MTJ being directly coupled to said second port of said first transistor;
   a second transistor having first and second ports, said first port of said second transistor being directly coupled to said first end of said selected MTJ; and
   a second neighboring MTJ having first and second ends, said first end of said second neighboring MTJ being directly coupled to said second port of said second transistor,
   wherein during programming of said selected MTJ, a first current flows through said first neighboring MTJ and said first transistor and a second current flows through said second neighboring MTJ and said second transistor,
   wherein said first current has a first pulse width that is narrower than a second pulse width of said second current.

6. The STT-MRAM array of claim 5, wherein said first current is less than said second current.

7. The STT-MRAM array of claim 5, wherein said first neighboring MTJ has been programmed prior to programming of said selected MTJ.

8. The STT-MRAM array of claim 5, wherein said second neighboring MTJ has not been programmed prior to programming of said selected MTJ.

* * * * *